(12) United States Patent
Deighton et al.

(10) Patent No.: US 11,974,417 B2
(45) Date of Patent: Apr. 30, 2024

(54) SHELTER WITH ELECTROMAGNETIC INTERFERENCE (EMI) PROTECTION AND COMPONENTS FOR SAME

(71) Applicant: HDT Expeditionary Systems, Inc., Solon, OH (US)

(72) Inventors: Charles Deighton, Milford, OH (US); Travis Lontz, Fredericksburg, VA (US); Wade Milek, Mason, OH (US); Brent Condie, Worley, ID (US)

(73) Assignees: HDT Expeditionary Systems, Inc., Solon, OH (US); Berg Companies, Inc., Spokane, WA (US)

( * ) Notice: Subject to any disclaimer, the term of this patent is extended or adjusted under 35 U.S.C. 154(b) by 0 days.

(21) Appl. No.: 18/107,401

(22) Filed: Feb. 8, 2023

(65) Prior Publication Data
US 2023/0255008 A1    Aug. 10, 2023

Related U.S. Application Data

(60) Provisional application No. 63/308,467, filed on Feb. 9, 2022.

(51) Int. Cl.
| | |
|---|---|
| *H05K 9/00* | (2006.01) |
| *E04B 1/343* | (2006.01) |
| *E04B 1/344* | (2006.01) |

(52) U.S. Cl.
CPC ....... *H05K 9/0001* (2013.01); *E04B 1/34336* (2013.01); *E04B 1/3444* (2013.01); *H05K 9/0084* (2013.01)

(58) Field of Classification Search
CPC ... H05K 9/0001; H05K 9/0003; E04B 1/3444
See application file for complete search history.

(56) References Cited

U.S. PATENT DOCUMENTS

| | | |
|---|---|---|
| 3,868,297 A | 2/1975 | Jamison |
| 3,994,105 A | 11/1976 | Jamison et al. |
| 4,726,158 A | 2/1988 | Fagnoni |
| (Continued) | | |

OTHER PUBLICATIONS

ASTM International, Designation E1925-04, "Specification For Engineering and Design Criteria for Rigid Wall Relocatable Structures", 2004, pp. 1-12.
(Continued)

*Primary Examiner* — Hung V Ngo
(74) *Attorney, Agent, or Firm* — LIPPES MATHIAS LLP

(57) ABSTRACT

A shelter with electromagnetic interference (EMI) protection includes first and second wall panels including EMI protection. The panels are connected by at least one of: (i) a hinged connection; (ii) a scissor joint connection. The hinged connection includes an EMI protected hinge that extends between the first and second panels and includes a first hinge leaf, a second hinge leaf, and a hinge joint. A flexible EMI protection covering extends across the hinge joint. The scissor joint connection includes a first hook connected to the first panel and a second hook connected to the second panel and an EMI gasket is located in an open channel of the first hook. Part of the first hook is received in a second open channel of the second hook and part of the second hook is received in the first open channel of the first hook and the gasket is compressed.

21 Claims, 8 Drawing Sheets

(56) References Cited

U.S. PATENT DOCUMENTS

| | | | | |
|---|---|---|---|---|
| 4,794,206 | A * | 12/1988 | Weinstein | H05K 9/0001 |
| | | | | 181/290 |
| 4,912,892 | A * | 4/1990 | Jurgensen | E04B 1/3444 |
| | | | | 296/26.15 |
| 5,039,826 | A * | 8/1991 | Newland | E05D 11/0081 |
| | | | | 49/478.1 |
| 5,170,901 | A | 12/1992 | Bersani | |
| 5,237,784 | A | 8/1993 | Ros | |
| 5,262,588 | A * | 11/1993 | Gallagher | H05K 9/0015 |
| | | | | 174/374 |
| 5,285,604 | A | 2/1994 | Carlin | |
| 5,732,839 | A | 3/1998 | Schimmang | |
| 5,761,854 | A | 6/1998 | Johnson | |
| 6,085,469 | A | 7/2000 | Wolfe | |
| 6,303,854 | B1 * | 10/2001 | Papaleo | H05K 9/0015 |
| | | | | 174/382 |
| 6,345,471 | B1 * | 2/2002 | Gyllenhammar | E04B 1/3444 |
| | | | | 296/26.02 |
| 7,243,464 | B1 | 7/2007 | Crowell | |
| 7,334,697 | B2 | 2/2008 | Myers et al. | |
| 7,418,802 | B2 | 9/2008 | Sarine | |
| 7,823,337 | B2 | 11/2010 | Pope | |
| 7,827,738 | B2 | 11/2010 | Abrams | |
| 7,874,107 | B1 | 1/2011 | Medley et al. | |
| 8,166,715 | B2 | 5/2012 | De Azambuja | |
| 8,650,806 | B1 * | 2/2014 | Condie | E04H 1/1205 |
| | | | | 52/79.5 |
| 8,770,422 | B2 | 7/2014 | Cantin | |
| 9,221,599 | B2 | 12/2015 | Brennan | |
| 9,702,160 | B2 | 7/2017 | Wirtz | |
| 9,820,415 | B1 * | 11/2017 | Rust | H05K 9/0001 |
| 2007/0144078 | A1 | 6/2007 | Frondelius | |
| 2007/0170740 | A1 | 7/2007 | Di Franco | |
| 2008/0134589 | A1 | 6/2008 | Abrams | |
| 2008/0256878 | A1 | 10/2008 | Berns | |
| 2009/0217600 | A1 | 9/2009 | De Azambuja | |
| 2011/0132421 | A1 | 6/2011 | Doisby | |
| 2013/0186010 | A1 * | 7/2013 | Condie | F24F 13/0227 |
| | | | | 52/79.5 |
| 2016/0265227 | A1 | 9/2016 | Clouse et al. | |
| 2017/0051503 | A1 | 2/2017 | Kalinowski | |
| 2017/0354064 | A1 | 12/2017 | Milek et al. | |
| 2019/0104651 | A1 | 4/2019 | Garagnani | |
| 2020/0229328 | A1 * | 7/2020 | Deighton | E04C 2/46 |
| 2023/0015863 | A1 * | 1/2023 | Lontz | H05K 9/0081 |

OTHER PUBLICATIONS hdtglobal.com, "Mission-Ready, Rigid Wall Shelters For Mobile or Semi-Permanent Operations" (2017) 2 pages.

hdtglobal.com, "Flat-Pack Rigid Wall Shelters Military-Grade, Fully Integrated, Any Size, Relocatable Shelters" (2017) 2 pages.

http://www.hdtglobal.com/product/emi-shelter/, "EMI Shelter", Sep. 23, 2018, 2 pages.

http://www.gichner.us/fscs.html, "Fixed Site Composite Shelter", Sep. 25, 2019, 1 page.

https://www.aarcorp.com/20-foot-non-expandable-iso-shelter/, "20-Foot Non-Expandable ISO Shelter", Oct. 2, 2019, 3 pages.

https://admissionsystems.com/en/services/shelter-systems, "General Dynamics Mission Systems, Shelters", Oct. 2, 2019, 3 pages.

https://www.sbir.gov/print/sbirsearch/detail/333512, "Low Cost Electro Magnetic Interference (EMI) Composite Shelter", Sep. 24, 2019, 2 pages.

https://www.standard.no/en/webshop/productcatalog/productpresent . . . , ASTM E1925:10, "Specification For Engineering and Design Criteria for Rigid Wall Relocatable Structures", Sep. 24, 2019, 1 page.

https://www.sbir.gov/print/sbirsearch/detail/1254591, "Electro-Magnetic Interference Composite Rigid Wall Shelter", Sep. 24, 2019, 4 pages.

http://www.seabox.com/products/category/containerized-shelters, "Containerized Shelters", Aug. 21, 2018, 1 page.

www.dupontbuilding.com, Dupont Building Inc. Flyer, "Fiberglass Shelters", Jan. 2020, 2 pages.

Technical Textiles Inc., Technical Application Guide PN#1401101S80CR, Shieldex Nora Dell-CR, 1 pp., Jul. 2, 2019.

3M Super 77 Multipurpose Cylinder Spray Adhesive Technical Data Sheet, 4 pps., Mar. 2012.

* cited by examiner

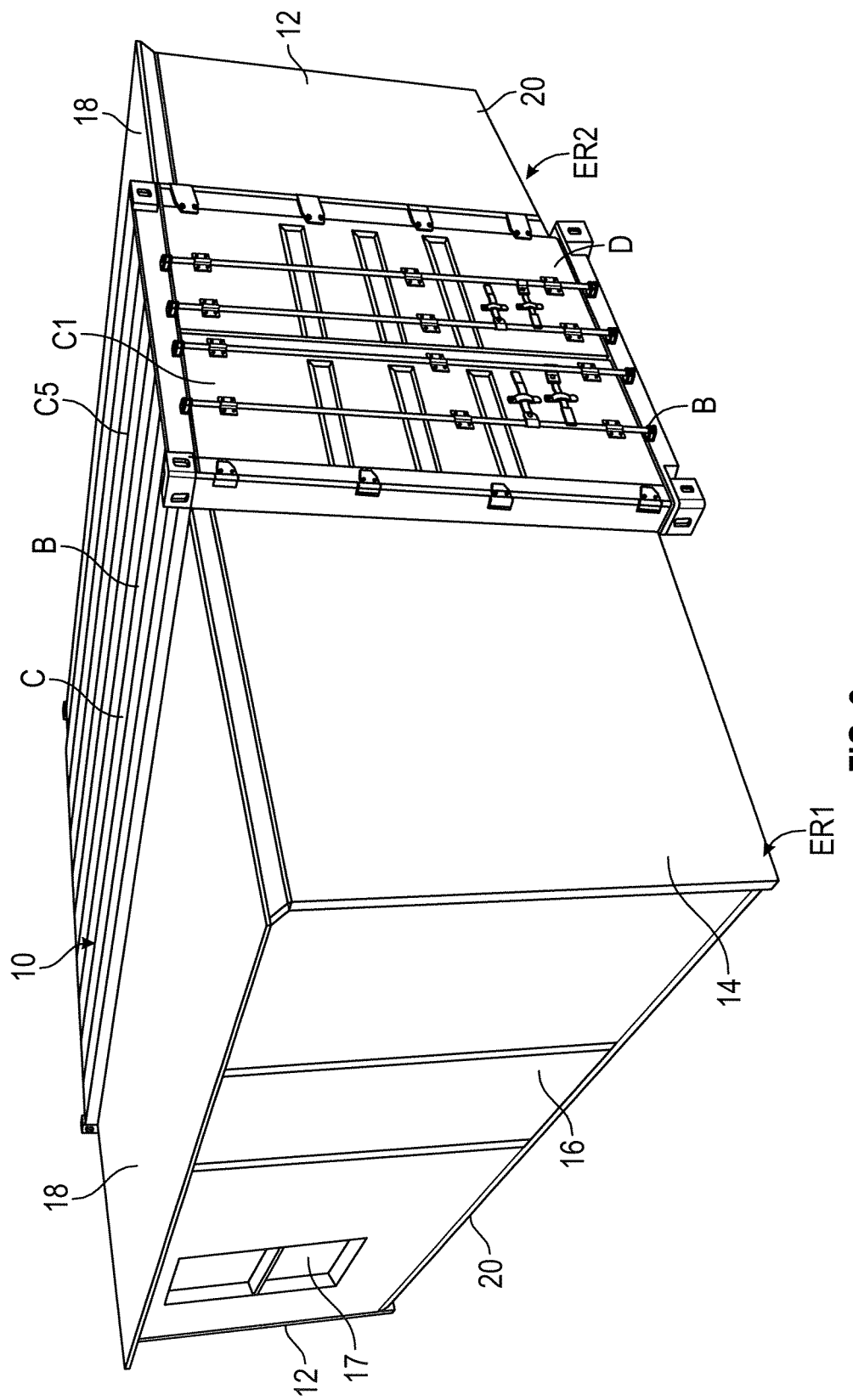

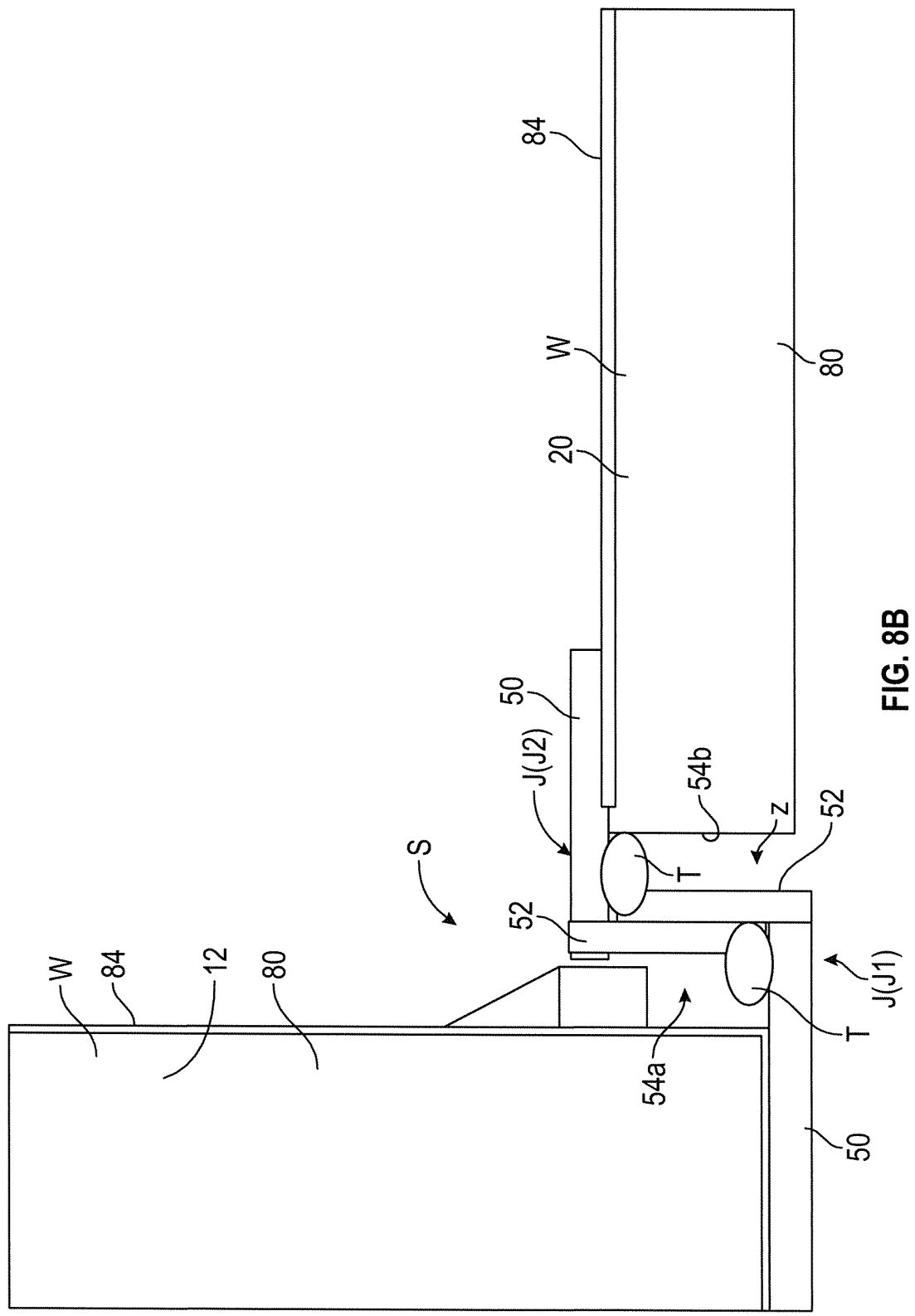

SHELTER WITH ELECTROMAGNETIC INTERFERENCE (EMI) PROTECTION AND COMPONENTS FOR SAME

CROSS-REFERENCE TO RELATED APPLICATION

This application claims priority from and benefit of the filing date of U.S. provisional application Ser. No. 63/308,467 filed Feb. 9, 2022, and the entire disclosure of said provisional application is hereby expressly incorporated by reference into this specification.

BACKGROUND INFORMATION

Portable shelters or containers for transportation to and deployment at a remote site are widely known. These shelters/containers are sometimes referred to as mission configurable shelters and are used by the military and others for establishing field offices, field hospitals, barracks, combat shelters, kitchens, mess halls, command posts, disaster relief shelters, decontamination stations, holding cells, communication centers, laboratories, schools, and the like. Portable shelters can be a fixed size or can include one or more expandable and collapsible wall sections that allow the shelter to be selectively collapsed for storage and transportation of the shelter and that can be selectively expanded for deployment of the shelter.

In certain applications, such portable shelters must provide protection against incoming and outgoing electromagnetic interference (EMI) energy. In the modern era, the use of sensitive electronic systems has become very important for industrial, commercial, and military applications. Electronic systems emit electromagnetic signals, and the electrical equipment is susceptible to interference from incoming emissions. Thus, EMI is a growing risk and an issue when numerous electronic systems are in close proximity to each other, as their emissions can interfere with each other, causing damage to the systems or improper operation. Furthermore, EMI is produced by electrical systems such as power transmission lines and even cell towers. Because of the widespread use of power lines and various other EMI emitting devices, EMI is a growing problem for electronic equipment.

Cyber security of electronic equipment is also a growing problem due to bad actors intercepting electromagnetic signals from such equipment as a means to obtain information that was intended to be secure and, thus, steal the information or spy on the transmission of such information. In addition, bad actors can generate and transmit EMI with the intent to destroy or damage important electronic equipment and/or jam important signals and data being transmitted. Thus, a containerized shelter which provides proper EMI protection would be very useful for both industrial and military applications.

SUMMARY OF THE PRESENT DEVELOPMENT

In accordance with one aspect of the present development, a portable shelter with electromagnetic interference (EMI) protection includes a plurality of wall panels that are configured to be arranged to define an interior space. The plurality of wall panels include a first wall panel and a second wall panel that each include an EMI protection layer. The first and second wall panels are connected together by at least one of: (i) a hinged connection; (ii) a scissor joint connection. The hinged connection includes an EMI protected hinge that extends along an interface between the first and second wall panels and that includes a first hinge leaf connected to the first wall panel, a second hinge leaf connected to the second wall panel, and a hinge joint that pivotally connects said first hinge leaf to said second hinge leaf. The hinge also includes a flexible EMI protection covering connected to both the first hinge leaf and the second hinge leaf and that extends across the hinge joint along an axial length of the hinge. The scissor joint connection includes a first hook connected to the first wall panel such that a first open channel is defined between the first hook and the first wall panel. The scissor joint connection also includes a second hook connected to the second wall panel such that a second open channel is defined between the second hook and the second wall panel. The scissor joint connection also further includes a first EMI gasket located the first open channel. The first and second hooks are arranged in opposed relation with each other such that part of the first hook is received in the second open channel and part of the second hook is received in the first open channel and the first EMI gasket is compressed in the first open channel between the first and second hooks when the first and second hooks are engaged to connect the first and second wall panels.

In accordance with another aspect of the present development, a shelter includes a first wall panel and a second wall panel. A hinged connection connects the first wall panel to the second wall panel. The hinged connection includes an EMI protected hinge including: a first hinge leaf connected to the first wall panel; a second hinge leaf connected to the second wall panel; and a hinge joint that pivotally connects the first hinge leaf to the second hinge leaf. A flexible EMI protection covering is connected to both the first hinge leaf and the second hinge leaf and extending across the hinge joint along an axial length of the hinge assembly.

In accordance with a further aspect of the present development a shelter includes a first wall panel, a second wall panel, and a scissor joint connection for selectively connecting the first wall panel to the second wall panel. The scissor joint connection includes: a first hook connected to the first wall panel such that a first open channel is defined between the first hook and the first wall panel; a second hook connected to the second wall panel such that a second open channel is defined between the second hook and the second wall panel; and a first EMI gasket located the first open channel. Part of the first hook is received in the second open channel and part of the second hook is received in the first open channel and the first EMI gasket is compressed in the first open channel between the first and second hooks when the first and second hooks are engaged to connect said first and second wall panels to each other.

BRIEF DESCRIPTION OF THE DRAWINGS

FIG. 2 is an isometric view of the shelter of FIG. 1 shown in its deployed configuration.

FIG. 8B is similar to FIG. 8A but shows the EMI protected sliding joint or scissor joint wall interface connection in an engaged position.

DETAILED DESCRIPTION

Figure 1:
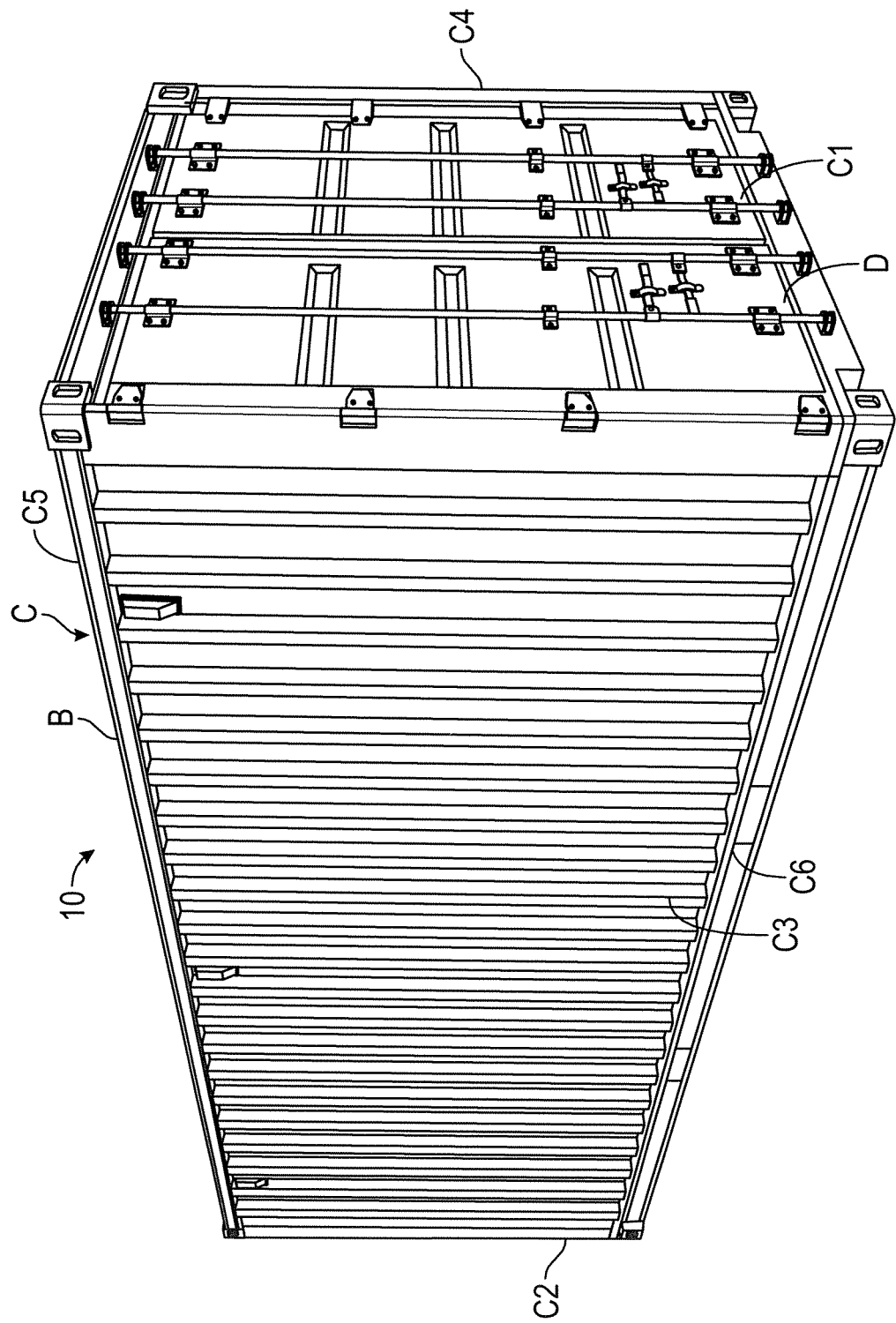
FIG. 1 is an isometric view of a shelter with EMI protection provided in accordance with an embodiment of the present disclosure, with the shelter shown in its stowed configuration.

FIGS. 1 & 2 illustrate a perspective view of a mission configurable portable shelter 10 with electromagnetic interference (EMI) protection according to a first embodiment of the present disclosure. The illustrated shelter 10 is a containerized shelter with a structure based upon a conventional cargo container C such as an ISO shipping container that can be, e.g., a 10-foot, 20-foot, 40-foot, or a Tricon size container. Other sizes or types of containers can be used to provide the basic structure of the shelter 10, or the shelter 10 can be non-container based and have a structure not based upon any particular shipping container. FIG. 1 shows the shelter 10 in its stowed configuration for storage and transport, and FIG. 2 shows the shelter in its deployed configuration for use.

Referring also to FIGS. 3A-3D, in the stowed state, shelter 10 is generally a rectangular cube structure or body B that includes opposite parallel, spaced-apart end walls C1,C2, first and second parallel spaced-apart side walls C3,C4, as well as parallel spaced-apart top and bottom walls C5,C6. One or more movable walls or portions of the walls C1-C6 can provide a door D. Referring to FIG. 2 and also to FIGS. 3A-3D, when expanded into its deployed state, the shelter 10 includes one or more expanded regions ER1,ER2 that extend outwardly from the body B and that each comprise first and second parallel spaced-apart end walls or wings 12,14, a vertical side wall 16 that extends between and interconnects the first and second end walls 12,14 at an outermost edge of the first and second end walls 12,14, a top wall 18 (roof) arranged transverse to the side wall 16 that extends between and interconnect the first and second end walls 12,14 at their respective upper edges, and a bottom wall 20 (floor) arranged transverse to the side wall 16 that extends between and interconnects the first and second end walls 12,14 at their respective lower edges.

The walls C1-C6 of the main body B of the container C are typically defined from sheets of steel or aluminum and thus provide EMI protection. For the expanded regions ER1,ER2, at least the first and second end walls 12,14, the side wall 16, and the top and bottom walls 18,20, and all joints therebetween, are EMI protected as described below to eliminate or at least attenuate incoming and outgoing EMI sufficiently to avoid the above-noted problems caused by EMI. If desired, the shelter 10 may also include one or more EMI protected windows 17 disposed in any one or more of the walls 12,14,16,18,20 as shown in FIG. 2. EMI protection for such windows 17 can be achieved by, for example, employing a ballistic glass, i.e., an acrylic material which absorbs EMI. Each wall 12,14,16,18,20 of the shelter 10 is sometimes generally referred to herein generally as a wall W or wall panel W.

Figure 3A:
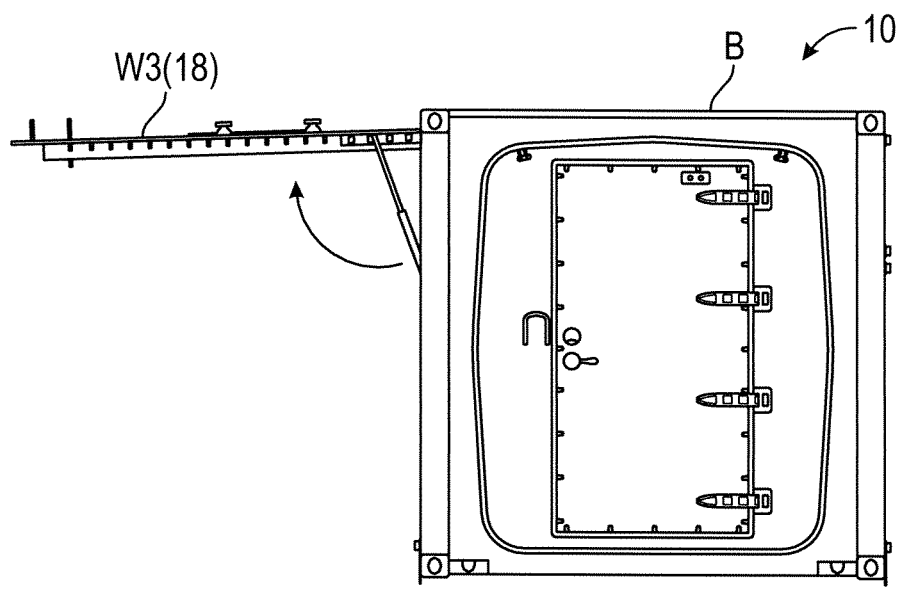
FIG. 3 (including FIGS. 3A, 3B, 3C, 3D) show a shelter with EMI protection provided in accordance with an embodiment of the present disclosure (similar to or the same as the shelter of FIG. 1) being reconfigured from its stowed configuration to its deployed configuration, with FIGS. 3A, 3C, and 3D being end views of the shelter and FIG. 3B being a top plan view of the shelter.
Figure 3B:
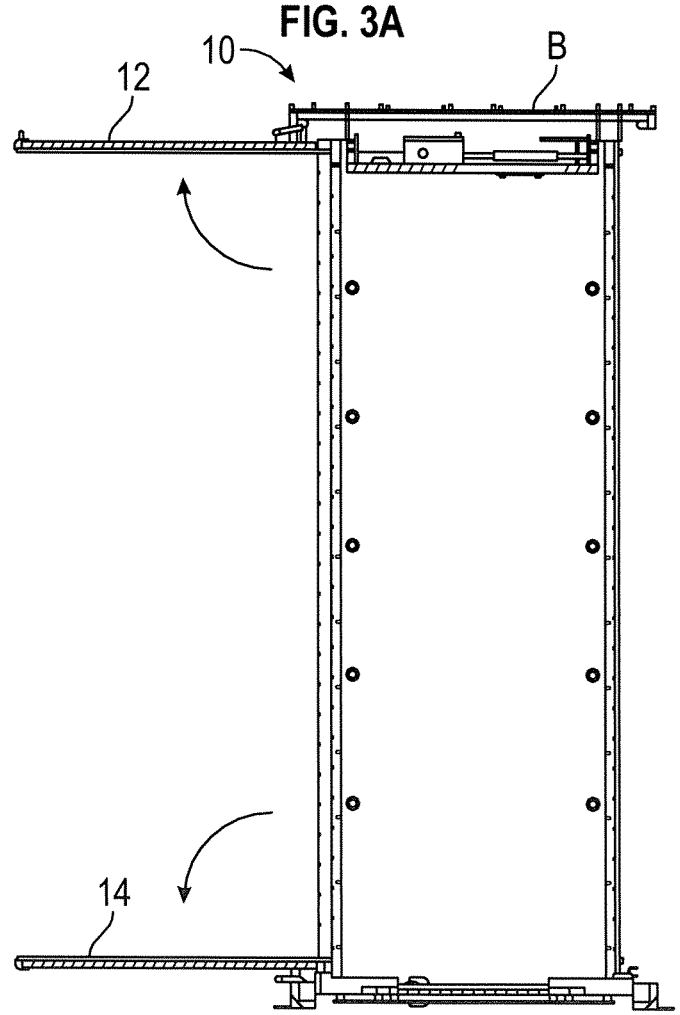
Figure 3C:
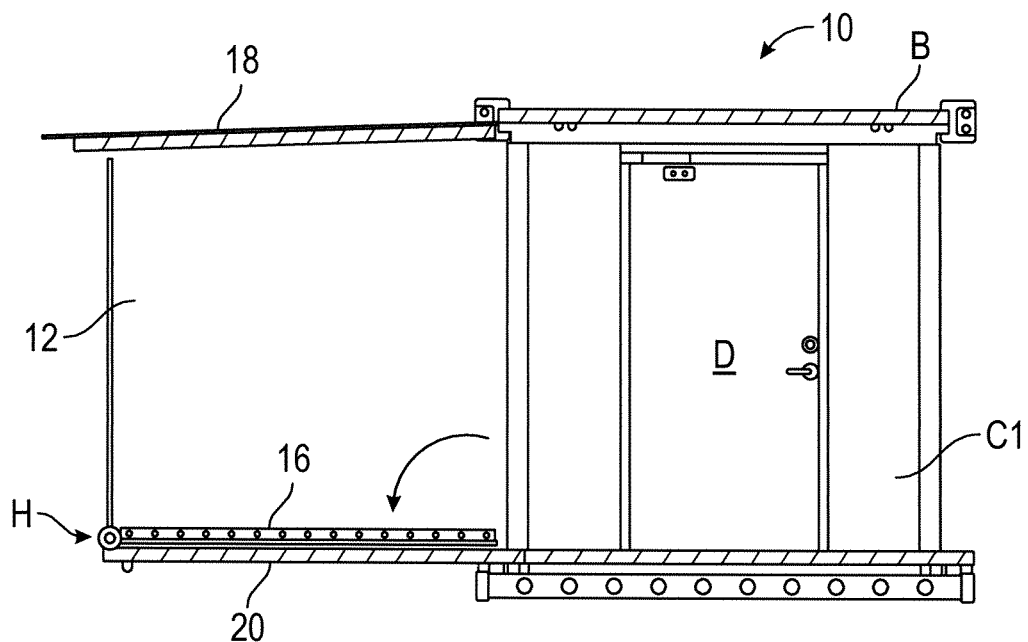
Figure 3D:
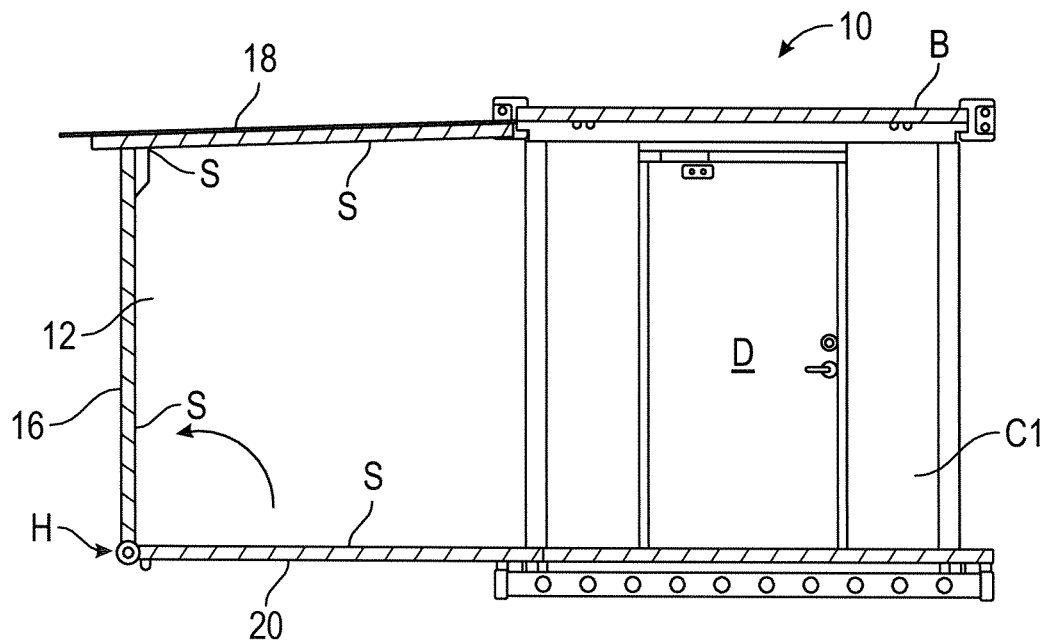

As shown in FIGS. 3A-3D, in the illustrated embodiment, the shelter 10 can be reconfigured from its stowed configuration of FIG. 1 to its deployed condition of FIG. 2 in a series of steps: (i) a side wall C3 of the container body B is pivoted upwardly about a horizontal pivot axis to form the top wall 18 of the expanded region ER1 as shown in FIG. 3A; (ii) the wings or end walls 12,14 of the expanded region ER1 are pivoted outwardly about respective vertical pivot axes as shown in FIG. 3B; (iii) the side wall 16 and bottom wall 20 are pivoted downwardly together about a horizontal pivot axis as shown in FIG. 3C; and (iv) the side wall 16 is pivoted upwardly away from the bottom wall 20 about a horizontal pivot axis to a vertical position extending between the top and bottom walls 18,20 as shown in FIG. 3D. The expanded region ER2 is configured in the same manner as shown for the expanded region ER1. The expanded regions ER1,ER2 are reconfigured to their respective stowed positions by reversing the above deployment sequence of operations.

Figure 4:
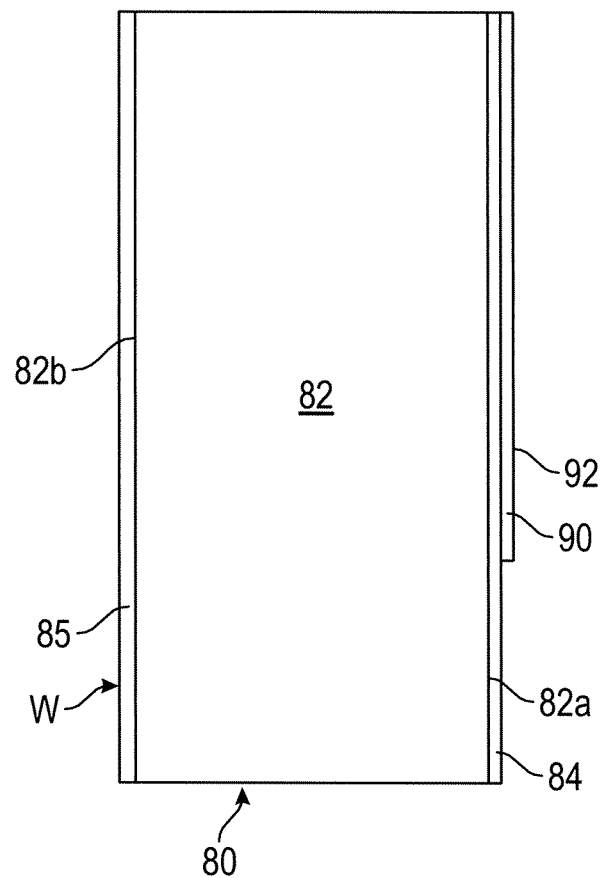
FIG. 4 is a section view of an EMI protected wall panel formed in accordance with an embodiment of the present disclosure that can be used in an EMI protected shelter such as the shelter of FIGS. 1 & 2 or other shelter formed in accordance with the present disclosure.

At least the walls W (12,14,16,18,20) of the expanded regions ER1 and ER2 can comprise a layered or sandwich-type (laminate) rigid or at least semi-rigid composite material wall panel 80 as shown in FIG. 4. In one embodiment, the wall panel 80 comprises a core 82 such as a fiberglass composite panel core but other materials can be used. Adhered to at least an inner surface 82a of the panel core 82 is an inner EMI protection layer 84 of metallic foil oriented toward the internal space of the shelter 10 defined between the walls W to provide EMI protection. In the illustrated embodiment, the opposite outer surface 82b of the panel core 82 includes an outer layer 85 that can be an EMI protection layer of metallic foil that is identical to or similar to the metallic foil 84 or that can comprise a durable, protective, weather-resistant sheet or coating material such as aluminum sheet and/or an applied paint or other coating or the outer layer 85 can be omitted. The inner foil layer 84 that provides EMI protection is preferably co-extensive with the inner surface 82a of the panel core 82 to which it is applied. In one embodiment, the metal foil layer 84 can comprise a thin layer or film made of a metallic foil material such as aluminum foil having a thickness of 0.005 inches (0.127 mm) or a thickness of 0.010 inches (0.254 mm). The thickness of the metal foil layer 84 can, in one embodiment, range between 0.005 inches and 0.020 inches (0.127 mm to 0.508 mm), inclusively, or can be thicker or thinner in certain applications. The metal foil layer 84 may be adhered to the core 82 by a spray-on adhesive, a film adhesive, a roll-on adhesive, or any other suitable adhesive applied to at least one of the surfaces meant to be adhered and/or the foil layer 84 can be mechanically connected to the panel 82 by fasteners, clips, a frame, or the like. The metal foil material of the metallic foil layer 84 can comprise aluminum, steel, copper, stainless steel, or any other suitable metal foil that prevents transmission of EMI therethrough and that can conduct EMI energy currents to a ground path or other destination for dissipation/attenuation. While the foil layer 84 is relatively thin, it can be patched as necessary if someone inadvertently punctures or tears the foil layer 84. Because the foil layer 84 is thin, it can better conform to the surface 82*a* to which it is adhered/connected, as compared to relatively thicker metal layers. As noted, in the illustrated embodiment, at least the inner foil layer 84 is provided on each panel 80, but the outer layer 85 of the panel 80 can additionally or alternatively comprise the same or different metallic foil used for the inner layer 84. In yet another embodiment, the inner foil layer 84 can be omitted altogether and the outer layer 85 can comprise an EMI protective metallic foil as described herein for the inner layer 84.

If desired, the foil 84 can be covered on its exposed face with a protective layer or coating 90 of a durable, wear-resistant, water-proof material for protection from damage caused by equipment, foot traffic, cleaning liquids, and environmental contaminants. In the illustrated embodiment, at least some of the wall panels 80 comprise a protective layer 90 comprising a gelcoat layer which can be, e.g., an epoxy or unsaturated polyester resin thermoset polymer coating or similar gelcoat layer that forms a hard durable surface that resists wear, protects the foil layer 84, and is non-permeable to water to allow for washing. The protective layer 90 can include an embossed or otherwise textured surface or applied coating 92 to provide non-skid characteristics and can be tinted or coated with a desired color.

In other embodiments, the core member 82 of the wall panel 80 may be made of other types of suitable materials, including one or more layers of different materials. These materials can include, e.g., fiber reinforced materials (carbon, aluminum or aramid fiber reinforced plastic materials), as well as thermally insulative materials such as rigid foam, or other materials such as corrugated non-metallic materials, wood, metal, and others. What is desirable for such wall panels is that they have a high strength-to-weight ratio, provide corrosion resistance, have a high stiffness-to-weight ratio, are chemically inert, have a high durability potential and good rigidity.

Figure 5:
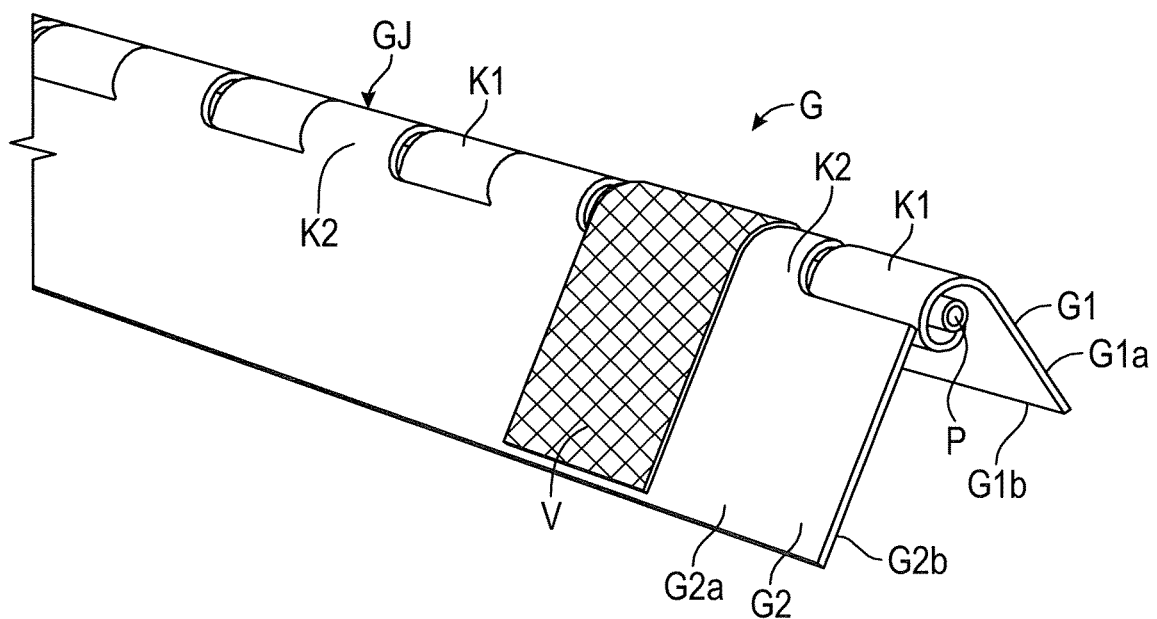
FIG. 5 is an isometric view of an embodiment of an EMI protected hinge or EMI protected hinge system used to pivotally connect first and second movable walls of the shelter of FIGS. 1 & 2, with the EMI protection covering of the hinge only partially shown.
Figure 7:
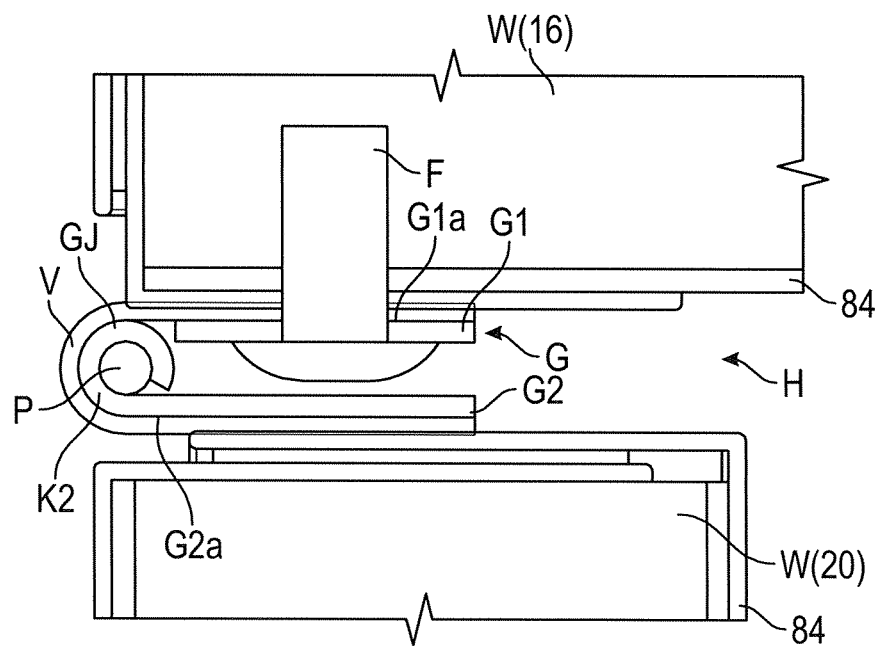
FIG. 7 is a partial section view of the EMI protected hinge of FIG. 5 operably installed to pivotally connect first and second wall panels (such as the wall panel of FIG. 4) of the shelter of FIGS. 1 & 2 and/or the shelter of FIG. 3.

The illustrated expanded regions ER1,ER2 of the shelter 10 each include at least one or more hinged connections between adjacent wall panels W such as the hinged connection H (FIGS. 3C & 3D) between the bottom wall (floor) 20 and the side wall 16. Each hinged connection H comprises an EMI protected hinge assembly or hinge G (shown by itself in FIG. 5) that extends continuously along the interface between the wall panels W being joined, such as the floor 20 and side wall 16. As shown in FIGS. 5 & 7, the hinge G comprises a first hinge leaf G1 with a plurality of first knuckles K1 and a second hinge leaf G2 with a plurality of second knuckles K2. The first and second knuckles are interleaved with each other in an alternating fashion such that bores located therein are aligned and registered with each other. A pin P extends through the aligned bores in the interleaved knuckles K1,K2 to form a hinge joint GJ that pivotally connects the first leaf G1 and the second leaf G2. With particular reference to FIG. 7, the first leaf G1 is connected by fasteners F and/or otherwise connected to a first one of the wall panels 16,20 and the second leaf G2 is connected by fasteners and/or otherwise connected to the second one of the wall panels 16,20. The first leaf G1 of the hinge G is preferably electrically connected to the EMI protection layer 84 of the first panel 16,20 and the second leaf G2 is preferably electrically connected to the EMI protection layer 84 of the second panel 16,20. The hinge G further comprises a flexible EMI protection covering V (only partially shown) that covers at least part of both the first leaf G1 and the second leaf G2, and that extends over/across and covers the hinge joint GJ defined by the interleaved knuckles K1,K2 and pin P. The EMI protection covering V extends continuously from the first leaf G1 to the second leaf G2 across the hinge joint GJ between the first hinge leaf G1 and the second hinge leaf G2 and extends continuously along the entire axial length of the hinge G between the wall panels 16,20 to inhibit EMI transmission through the hinge joint GJ such that EMI cannot enter or exit the expansion region ER1,ER2 of the shelter 10 through gaps in the hinge joint GJ. As shown in the illustrated embodiment, the EMI protection covering V is externally located on the hinge G so as to be located on the respective outer faces G1*a*,G2*a* of the hinge leaves G1,G2, but the EMI protection covering V can additionally or alternatively be internally located on the hinge G, such that it is located on the respective inner faces G1*b*,G2*b* of the hinge leaves G1,G2.

Figure 6:
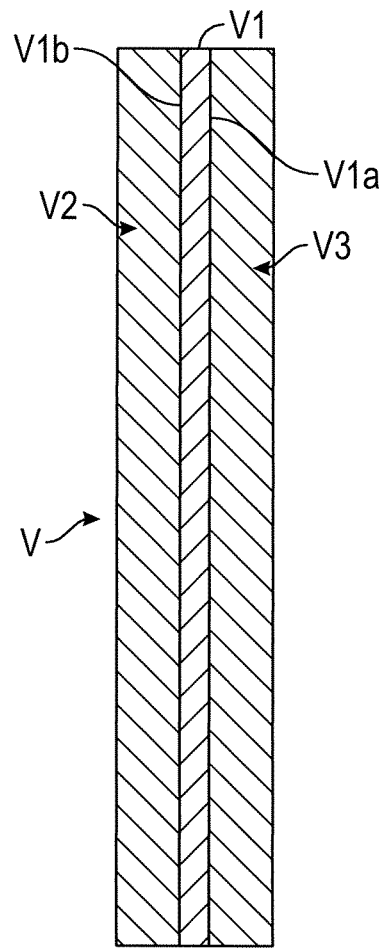
FIG. 6 is a greatly enlarged (not to scale) section view of an example of an EMI protection covering that forms part of the EMI protected hinge of FIG. 5.

In one embodiment, as shown in FIG. 6, the flexible EMI protection covering V comprises a flexible laminate or composite structure comprising an inner layer V1 of metallic foil such as aluminum foil having opposite first and second faces V1*a*,V1*b*. In one example, the metal foil layer V1 has a thickness in a range of 0.005 inches to 0.020 inches (0.127 mm to 0.508 mm), inclusive, or can be thicker or thinner in certain applications. The foil layer V1 provides excellent EMI blocking and attenuation. First and second fabric layers V2,V3 are respectively adhesively connected or bonded to and cover the first and second faces V1*a*,V1*b* of the inner foil layer V1 to provide durability, strength, and protection to the inner foil layer V1. The fabric of the layers V2,V3 can be woven or non-woven, natural, or synthetic. In one preferred embodiment, the fabric layers V2,V3 each comprise an EMI protective fabric comprising a fabric substrate coated with a metal coating (metalized fabric) that blocks transmission of EMI and that provides good electrical conductivity to the fabric. In one non-limiting embodiment, the fabric layers V2,V3 comprise a Nylon ripstop fabric with a metalized coating such as nickel/copper/silver plated Nylon fabric, but other metal-coated (metalized) fabrics can be used and it is not intended that the present disclosure be limited to any particular EMI protective fabric. The EMI protective fabric V2,V3 can be adhered to the opposite inner and outer faces V1*a*,V1*b* of the foil V1 using any suitable adhesive that is strong, flexible, and durable so as to withstand repeated flexing as required to accommodate repeated pivoting movement of the hinge G. In one non-limiting example, a suitable adhesive is a spray-on adhesive available commercially from the 3M Company under the trademark SUPER 77, but it is not intended that the present disclosure be limited to any particular adhesive. In some embodiments, the flexible EMI laminate V comprising an inner aluminum foil layer V1 and outer metalized fabric layers V2,V3 is believed to provide EMI protection in the range of 150 kilohertz (kHz)-20 gigahertz (GHz). The flexible EMI laminate V is also formable and holds its shape when bent around the hinge G which facilitates connection of the EMI protection covering V to the hinge leaves G1,G2.

It should be recognized that the electrical conductivity of the EMI protection covering V allows EMI induced electrical currents to be conducted across the hinge joint GJ from the first leaf G1 to the second leaf G2 which, in turn, allows such electrical currents in the respective foil layers 84 of the wall panels W (16,20) to be conducted across the hinge G such that a Faraday cage is defined by the walls W and the hinge G. In particular, the EMI protection covering facilitates electrical conduction of the EMI induced electrical currents across any air gaps in the hinge joint GJ.

Figure 8A:
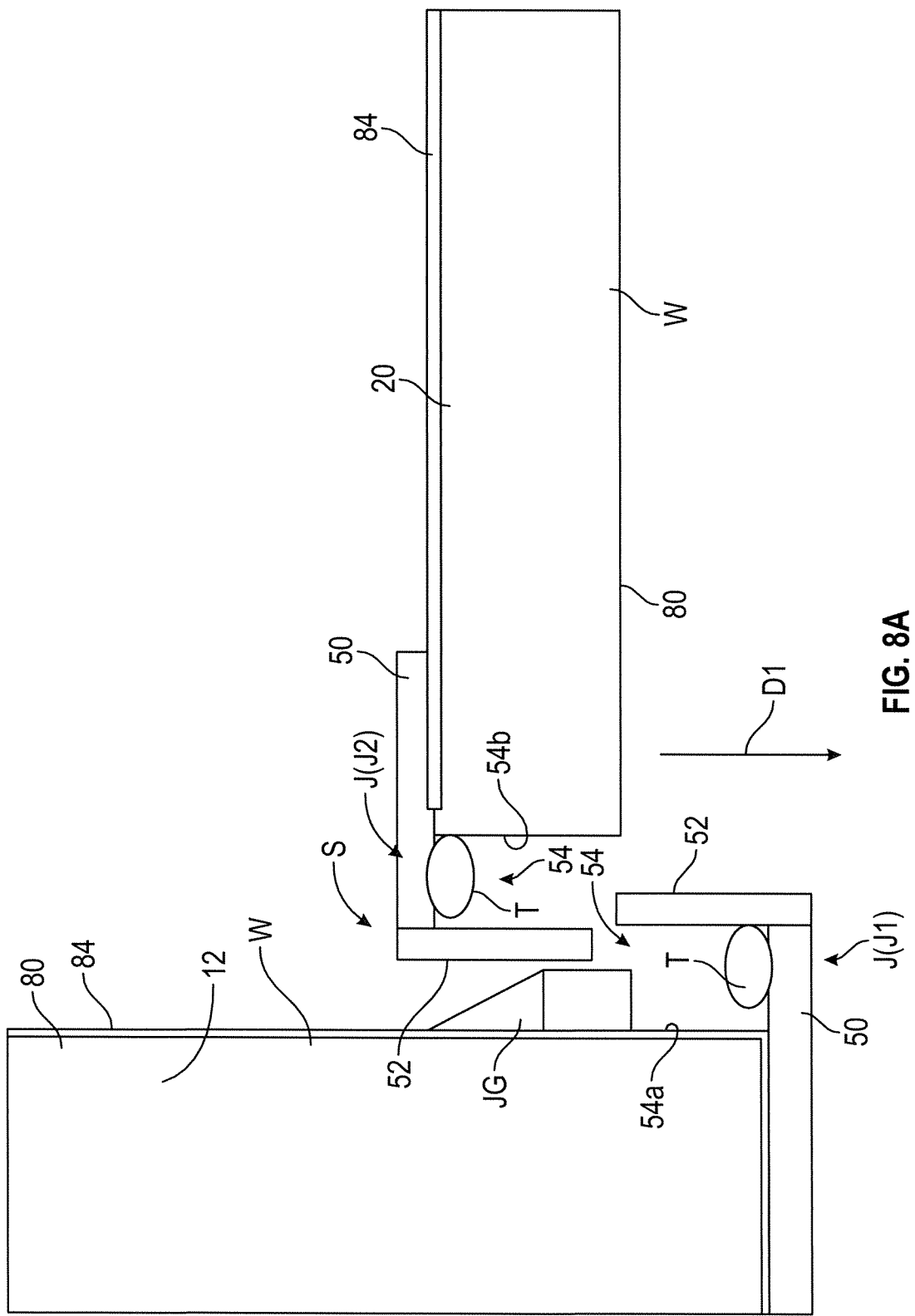
FIG. 8A is a side view of an EMI protected sliding joint or scissor joint wall interface connection used to engage or interconnect first and second movable walls of the shelter of FIGS. 1 & 2 and/or the shelter of FIG. 3, with the sliding joint shown in a disengaged position.

The illustrated expanded regions ER1,ER2 of the shelter 10 also include at least one or more sliding joint or scissor joint connections S (FIG. 3D) between adjacent first and second wall panels W such as the sliding joint connections S between each end wall 12,14 and the side wall 16, the top wall (roof) 18, and the bottom wall (floor) 20. The connection between the side wall 16 and the roof 18 can also be a sliding joint connection S. FIGS. 8A and 8B show an example of these sliding joint or scissor joint connections S, wherein the sliding joint connection S joining the end wall 12 and the floor 20 is shown as an example (the other sliding joints S are similarly and correspondingly structured). FIG. 8A shows the sliding joint connection S before the connection is made. The sliding joint comprises first and second mating hooks J connected respectively to the first and second wall panels 12, 20, i.e., a first hook J1 connected to the first wall panel 12 and a second hook J2 connected to the second wall panel 20. The hooks J extend along the entire length of the respective panels 12,20. The hooks J each comprise an L-shaped body including a first leg 50 that is connected to and that projects outwardly away from the respective wall 12,14 and a second leg 52 connected to and projecting outwardly from an outer end of the first leg 50 and arranged transversely such as perpendicularly relative to the first leg 50 such that an open channel 54 is defined between the second leg 52 and the respective panel 12,20, i.e., a first open channel 54a is defined between the second leg 52 of the first hook J1 and the first wall panel 12, and a second open channel 54b is defined between the second leg 52 of the second hook J2 and the second wall panel 20. The hooks J are arranged in opposed facing relation with respect to each other such that part of the first hook J1 is received in the second channel open 54b and part of the second hook J2 is received in the first open channel 54a. More particularly, the second leg 52 of the first hooks J1 is slidably received in the second open channel 54b defined by the second hook J2 and the second leg 52 of the second hook J2 is slidably received in the first open channel 54a defined by the first hook J1 when the sliding joint S is completed or made by movement of the panel 20 from the position shown in FIG. 8A in the direction D1 to the final or operative position shown in FIG. 8B or vice versa. When the first and second hooks J1,J2 are engaged, the respective second legs 52 lie adjacent each other and are arranged parallel with respect to each other. One or more polymeric or metal guides JG can be connected to the first panel 12 adjacent the first open channel 54a and/or can be connected to the second panel 20 adjacent the second open channel 54b. The guide(s) JG of a panel 12,20 contacts the hook J of the other panel 20,12 and guides the respective hook J into the open channel 54. The first and second hooks J1,J2 are shown herein as being L-shaped with planar or linear first and second legs 50,52 connected at a 90-degree angle, but the first and second hooks J1,J2 can include curved legs 50,52 or portions thereof and/or can be otherwise shaped. Also, the first and second hooks J1,J2 are shown herein as being the same shape but they can be shaped differently with respect to each other and need not be the same size or shape.

The sliding joint S further comprises a flexible, electrically conductive EMI gasket T located in at least one and preferably in each channel 54 and extending continuously and coextensively with the channel 54, i.e., the gasket T extends along the hook J continuously for the entire length of the joint S. In the illustrated embodiment, a first EMI gasket T is located in and extends continuously and coextensively with the first channel 54a, and a second EMI gasket T is located in and extends continuously and coextensively with the second channel 54b. As noted, while two gaskets T are shown, it is possible to provide a joint S with only a single gasket T, i.e., either the first or second EMI gasket T. The gasket T can be adhesively secured and/or fastened to the first leg 50 and/or second leg 52. When the sliding joint S is completed as shown in FIG. 8B, the second leg 52 of each hook J engages and compresses the EMI gasket T such that an EMI barrier is defined by the interface of the leg 52 and the gasket T and such that the second legs 52 of each hook J are electrically connected to the other hook J with which they are engaged. The respective second legs 52 can also be in direct contact with each other as an additional electrical conductivity path between the first and second engaged hooks J. The first leg 50 of each hook J is electrically connected to the inner foil layer 84 of the panel W to which the hook J is connected. Thus, the sliding joint S electrically connects the foil layers 84 of the respectively panels to each other through the hooks J and gasket(s) T as required to provide am EMI attenuating Faraday cage.

The sliding joint (scissor joint) connections as shown in FIGS. 8A and 8B thus define an EMI protected joints between adjacent connected wall panels W. In addition to the EMI barriers provided by the gaskets T, which seal any open gaps between the hooks, the hooks J define a labyrinth structure Z when engaged with each other as shown in FIG. 8B. As shown herein, the labyrinth structure Z preferably comprises at least four 90-degree corners or turns that any EMI energy must pass through to permeate the sliding joint S. EMI energy is attenuated for each 90-degree corner it must pass through, such that the labyrinth Z further attenuates EMI entry into or exit from the interior of the shelter 10 by way of the sliding joint S.

The gaskets T can be EMI metal mesh gaskets of circular, oval, rectangular, or other suitable cross section to accommodate many different attenuation and mounting requirements encountered in EMI shielding applications. Thus, for example, the gaskets T can be rectangular, round, oval, round with a fin or double round in order to ensure that enclosures or other equipment will be EMI sealed appropriately. In one embodiment, the gaskets T can be made of a knitted wire mesh with the material of the gaskets being made of, for example, a nickel-copper alloy, such as Monel, a ferrous alloy, such as a tin-steel combination or a beryllium copper alloy.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

The invention claimed is:

1. A portable shelter with electromagnetic interference (EMI) protection, said shelter comprising:
   a plurality of wall panels that are configured to be arranged to define an interior space, said plurality of wall panels comprising a first wall panel and a second wall panel that each include an EMI protection layer;
   wherein said first and second wall panels are connected together by at least one of:
   (i) a hinged connection comprising an EMI protected hinge that extends along an interface between the first and second wall panels, said hinge comprising: a first hinge leaf connected to the first wall panel; a second hinge leaf connected to the second wall panel; and hinge joint that pivotally connects said first hinge leaf to said second hinge leaf; and a flexible EMI protection covering connected to both the first hinge leaf and the second hinge leaf and extending across the hinge joint along an axial length of the hinge;

(ii) a scissor joint connection comprising: a first hook connected to the first wall panel such that a first open channel is defined between the first hook and the first wall panel; a second hook connected to the second wall panel such that a second open channel is defined between the second hook and the second wall panel; a first EMI gasket located the first open channel; wherein said first and second hooks are arranged in opposed relation with each other such that part of the first hook is received in the second open channel and part of the second hook is received in the first open channel and said first EMI gasket is compressed in said first open channel between the first and second hooks when said first and second hooks are engaged to connect said first and second wall panels.

2. The portable shelter with EMI protection as set forth in claim 1, wherein said flexible EMI protection covering of said hinge electrically connects said first hinge leaf to said second hinge leaf.

3. The portable shelter with EMI protection as set forth in claim 2, wherein said first hinge leaf is electrically connected to said EMI protection layer of said first wall panel and said second hinge leaf is electrically connected to said EMI protection layer of said second wall panel such that said flexible EMI protection covering of said hinge electrically connects said EMI protection layer of said first wall panel to said EMI protection layer of said second wall panel.

4. The portable shelter with EMI protection as set forth in claim 2, wherein said flexible EMI protection covering of said EMI protected hinge comprises a flexible laminate comprising a metallic foil layer.

5. The portable shelter with EMI protection as set forth in claim 4, wherein said flexible laminate comprises said metallic foil layer located between first and second fabric layers.

6. The portable shelter with EMI protection as set forth in claim 5, wherein at least one of said first and second fabric layers comprises a metalized fabric comprising a fabric substrate and a metal coating located on said fabric substrate.

7. The portable shelter with EMI protection as set forth in claim 6, wherein said metallic foil layer of said flexible EMI protection covering comprises aluminum foil having a thickness in the range of 0.005 inches to 0.020 inches, inclusive.

8. The portable shelter with EMI protection as set forth in claim 6, wherein both said first and second fabric layers comprise said metalized fabric, and wherein said first and second layers are adhesively bonded to opposite inner and outer faces of said metallic foil layer.

9. The portable shelter with EMI protection as set forth in claim 1, wherein said EMI protection layer of said first and second wall panels comprises a metallic foil.

10. The portable shelter with EMI protection as set forth in claim 9, wherein said metallic foil comprises aluminum foil having a thickness in the range of 0.005 inches to 0.020 inches, inclusive.

11. The portable shelter with EMI protection as set forth in claim 1, wherein said first hook of said scissor joint is electrically connected to said EMI protection layer of said first wall panel and said second hook of said scissor joint is electrically connected to said EMI protection layer of said second wall panel.

12. The portable shelter with EMI protection as set forth in claim 11, further comprising a second EMI gasket located the second open channel such that said second EMI gasket is compressed in said second open channel between the first and second hooks when the first and second hooks are engaged to connect said first and second wall panels.

13. The portable shelter with EMI protection as set forth in claim 12, wherein said first and second EMI gaskets each comprise EMI metal mesh gaskets.

14. The portable shelter with EMI protection as set forth in claim 12, wherein:

said first and second hooks of said scissor joint each comprise an L-shaped body including a first leg and a second leg connected to and arranged transversely relative to the first leg, wherein the first leg of the first hook is connected to and projects outwardly away from the first wall panel and the first leg of the second hook is connected to and projects outwardly away from the second wall panel; and said second leg of the first hook is received in the second open channel and compresses said second EMI gasket and said second leg of the second hook is received in the first open channel and compresses said first EMI gasket.

15. A shelter comprising:
a first wall panel;
a second wall panel;
a hinged connection that connects said first wall panel to said second wall panel, said hinged connection comprising an EMI protected hinge comprising: a first hinge leaf connected to the first wall panel; a second hinge leaf connected to the second wall panel; and hinge joint that pivotally connects said first hinge leaf to said second hinge leaf; and a flexible EMI protection covering connected to both the first hinge leaf and the second hinge leaf and extending across the hinge joint along an axial length of the hinge assembly.

16. The shelter as set forth in claim 15, wherein said flexible EMI protection covering of said hinge comprises a flexible laminate including a metallic foil layer bonded to a fabric layer.

17. The shelter as set forth in claim 16, wherein said fabric layer comprises a fabric substrate coated with a metallic coating.

18. The shelter as set forth in claim 15, wherein said flexible EMI protection covering of said hinge comprises a flexible laminate including a metallic foil layer comprising inner and outer faces to which first and second metalized fabric layers are respectively bonded.

19. A shelter comprising:
a first wall panel;
a second wall panel;
a scissor joint connection for selectively connecting said first wall panel to said second wall panel, said scissor joint connection comprising: a first hook connected to the first wall panel such that a first open channel is defined between the first hook and the first wall panel; a second hook connected to the second wall panel such that a second open channel is defined between the second hook and the second wall panel; and a first EMI gasket located the first open channel;

wherein part of the first hook is received in the second open channel and part of the second hook is received in the first open channel and said first EMI gasket is compressed in said first open channel between the first and second hooks when said first and second hooks are engaged to connect said first and second wall panels to each other.

20. The shelter as set forth in claim 19, further comprising a second EMI gasket located the second open channel such that said second EMI gasket is compressed in said second open channel between the first and second hooks when the first and second hooks are engaged to connect said first and second wall panels.

21. The shelter as set forth in claim 20, wherein:
said first and second hooks of said scissor joint each comprise an L-shaped body including a first leg and a second leg connected to and arranged transversely relative to the first leg, wherein the first leg of the first hook is connected to and projects outwardly away from the first wall panel and the first leg of the second hook is connected to and projects outwardly away from the second wall panel; and,
said second leg of the first hook is received in the second open channel and compresses said second EMI gasket and said second leg of the second hook is received in the first open channel and compresses said first EMI gasket.

\* \* \* \* \*